United States Patent [19]
Cooper et al.

[11] Patent Number: 5,458,408
[45] Date of Patent: Oct. 17, 1995

[54] ENCLOSURE WITH SPILL-RESISTANT VENTILATION FOR ELECTRONIC EQUIPMENT

[75] Inventors: Stephen V. Cooper; Kurt F. Olsen, both of McMinnville, Oreg.

[73] Assignee: Hewlett-Packard Corporation, Palo Alto, Calif.

[21] Appl. No.: 43,642

[22] Filed: Apr. 6, 1993

[51] Int. Cl.$^6$ ............................ A47B 75/00; A47B 77/08
[52] U.S. Cl. ...................................... 312/213; 312/223.2
[58] Field of Search .................... 312/223.2, 213, 312/234, 292, 7.2, 236, 102; 454/184; 98/40 VM; 361/383, 364–368

[56] References Cited

U.S. PATENT DOCUMENTS

| | | | |
|---|---|---|---|
| 3,756,138 | 9/1973 | Box | 98/40 VM |
| 4,716,493 | 12/1987 | Zelkowitz | 361/390 X |
| 4,880,594 | 11/1989 | Fu | 312/236 X |
| 5,071,203 | 12/1991 | Boyd | 312/7.2 |
| 5,118,173 | 6/1992 | Proctor et al. | 312/213 |

FOREIGN PATENT DOCUMENTS 2210205A  6/1989  United Kingdom ............. H05K 7/20

*Primary Examiner*—Stephen C. Pellegrino
*Assistant Examiner*—Nancy Mulcare

[57] ABSTRACT

An enclosure for electronic equipment is disclosed having a series of vents arranged for ventilating the enclosure while minimizing flowing of spilled liquid into the enclosure through the vents. A series of vent pockets is formed in a side wall of the enclosure, extending downward from a top surface of the enclosure so that spilled liquid flows downward into the vent pockets. The vent pockets have a generally u-shaped configuration with an aperture extending through one of the side walls for ventilation. The apertures thus are formed in a plane substantially orthogonal to the top surface and the side wall of the enclosure. A liquid flow path through the vent pocket diverts the spilled liquid away from the aperture, so as to minimize flow of the liquid through the aperture into the enclosure. Another aspect of the invention is a low-cost method of making the enclosure by injection molding.

17 Claims, 4 Drawing Sheets

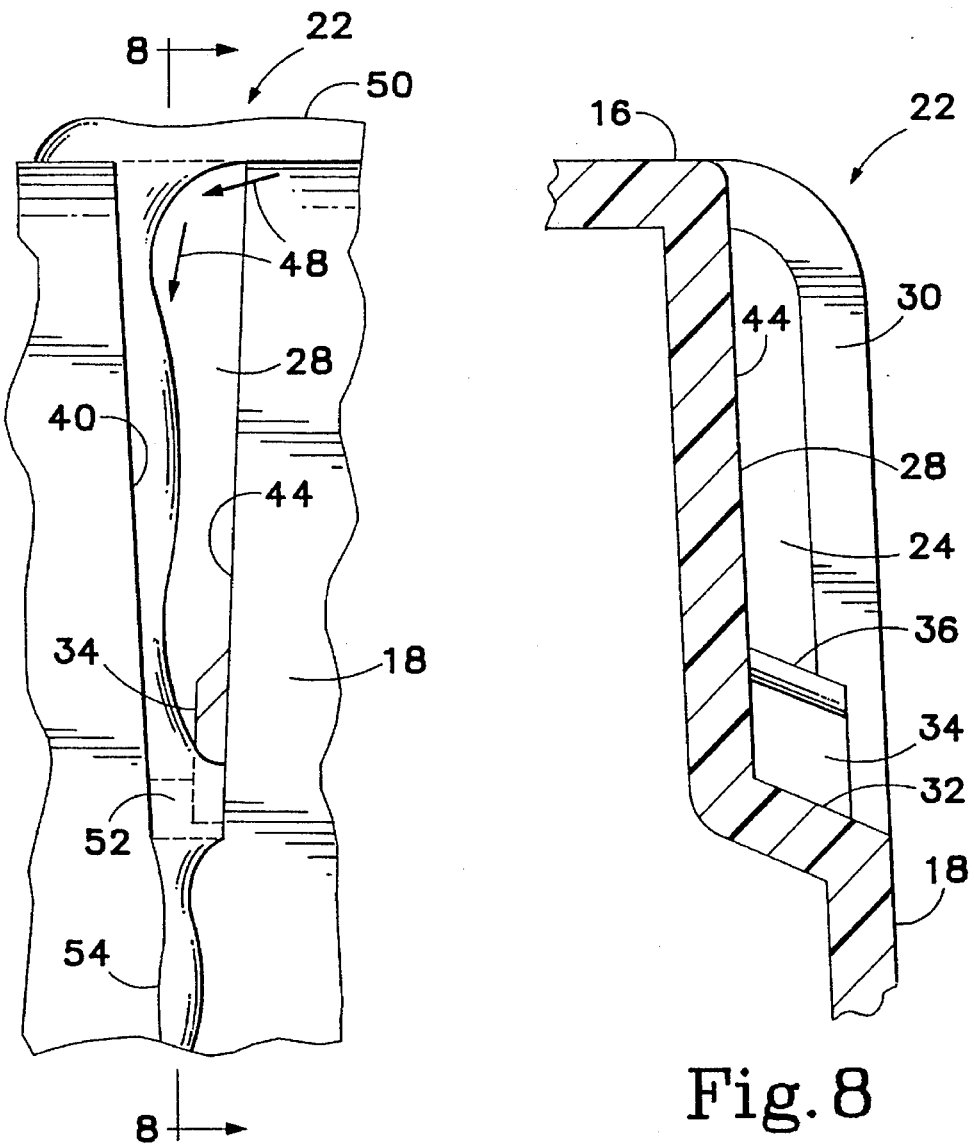
Fig. 7
Fig. 8
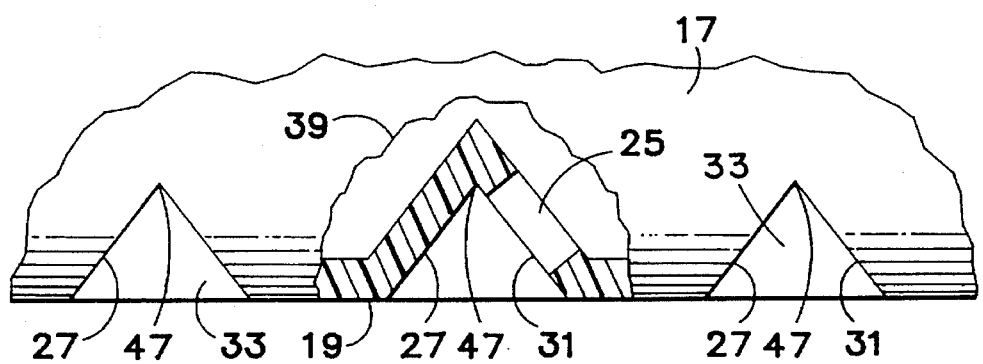
Fig. 9

ENCLOSURE WITH SPILL-RESISTANT VENTILATION FOR ELECTRONIC EQUIPMENT

FIELD OF THE INVENTION

The present invention relates generally to cases or enclosures for housing electronic equipment and more particularly, to enclosures that are arranged to provide ventilation for electronic equipment housed therein while preventing spilled liquids from entering the enclosure and potentially damaging the electronics.

Various enclosures are known for housing electronic equipment. Frequently, enclosures are formed of rigid materials such as metals or polymeric materials to protect the internal electronic circuitry from mechanical abuse or damage from contact with liquids which could short out the circuitry or damage various components thereof. Electronic equipment enclosures also serve to protect users from inadvertent contact with the internal equipment which could lead to personal injury through electric shock. This is particularly important where the electronic equipment employs high voltages and/or high energy levels, such as those found in a defibrillator.

At the same time, it is well known that electronic equipment generates heat during operation which must be exhausted from the enclosure or other means provided to prevent the internal temperature from exceeding the intended operating temperature of the equipment. Typically, forced and/or convective air flow is the selected means for carrying excess heat out of the enclosure. It is known to provide openings in the enclosure, called vents, for this purpose. The particular size and arrangements of the vents is determined by the airflow requirements for adequate cooling, and may also be affected by aesthetic considerations. However, vent openings may allow a person's finger, a spilled liquid or other foreign object to enter the enclosure where they might contact the internal electronic circuitry.

Accordingly, what is needed is an electronic equipment enclosure with means for providing adequate ventilation of electronic equipment housed within the enclosure, while preventing spilled liquids or other foreign objects from entering the enclosure.

SUMMARY OF THE INVENTION

In view of the foregoing background, it is an object of the invention to provide for adequate ventilation in an electronic equipment enclosure while preventing foreign objects from entering the enclosure. Another object of the invention is to provide adequate ventilation while preventing spilled liquids from entering an electronic equipment enclosure. A further object of the invention is to minimize the costs of manufacturing an electronic equipment enclosure having spill-resistant ventilation. A further object is to provide for injection molding of an electronic equipment case having spill-resistant ventilation while minimizing tooling costs associated therewith.

One aspect of the present invention is an equipment enclosure having a substantially horizontal top surface coupled to a substantially vertical sidewall. A series of vent pockets are formed in the sidewall adjacent the top surface, each vent pocket having an open top end in communication with the top surface and extending downward from the top surface, so that a liquid spilled onto the top surface may flow downward into the vent pocket through the open top. Each vent pocket further includes an aperture that extends through the sidewall in communication with the interior of the enclosure for ventilating the enclosure, and each vent pocket further includes means for directing the spilled liquid through the vent pocket along a predetermined flow path that generally circumvents the aperture so that the liquid does not enter the enclosure through the aperture.

In the preferred embodiment, each vent pocket more specifically comprises a generally U-shaped configuration in top view, including a closed sidewall, a front wall and an open sidewall, all generally vertical and all interconnected in the generally U-shaped relationship. In such an embodiment, the front wall forms the bottom of the U-shape and is oriented toward the interior of the enclosure. In this manner, the front wall is generally parallel to the enclosure sidewall. The closed and open sidewalls of the vent pocket are generally perpendicular to both the top surface and the side wall of the enclosure. They may be sloped slightly toward each other to facilitate manufacture. The ventilation aperture is formed in the open sidewall of the vent pocket so that the aperture lies in a generally vertical plane, substantially perpendicular to the enclosure side wall. In this embodiment, the flow path is generally along a corner formed by the intersection of the closed sidewall and the front wall of the vent pocket. In an alternative embodiment, the closed sidewall and the open sidewall form a generally V-shape arrangement in top view, intersecting each other along respective edges of the sidewalls that would be spaced apart by the front wall in the preferred embodiment.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 7 is an enlarged, rear elevational view of a portion of the enclosure illustrating flow of a spilled liquid along a flow path through a vent pocket.

FIG. 8 is a cross-sectional view of the vent pocket taken along line 8—8 of FIG. 7 with the spilled liquid omitted for clarity.

FIG. 9 is an enlarged top view, partially broken away to cross-section, of a series of V-shaped vent pockets formed in an enclosure according to an alternative embodiment of the invention.

DETAILED DESCRIPTION OF THE PREFERRED EMBODIMENT

Figure 1:
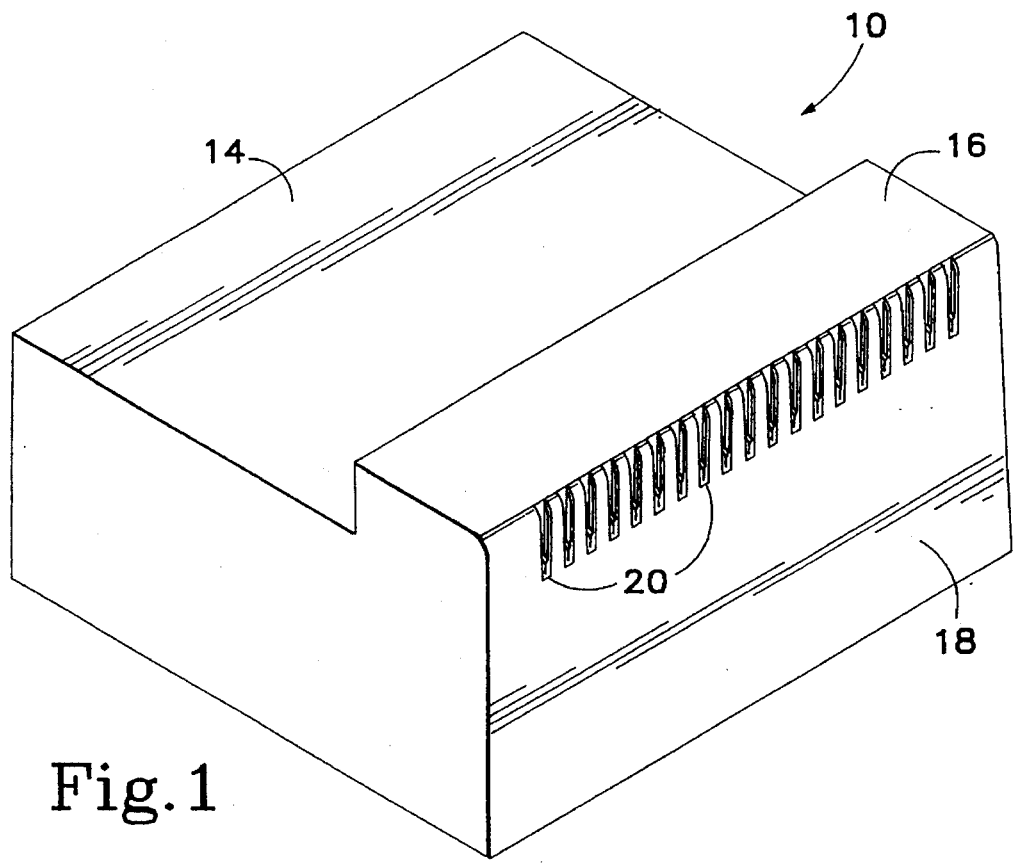
FIG. 1 is a perspective view of an electronic equipment enclosure according to the present invention.

FIG. 1 is a perspective view of an electronic equipment enclosure 10 according to the present invention. Enclosure 10 has a top surface that comprises a lower portion 14 and an elevated portion 16, both of which are generally planar and are generally horizontal when the enclosure is positioned upright as shown. Enclosure 10 further has a substantially vertical side wall 18 coupled to the top surface elevated portion 16. A series of vent pockets 20 are formed in the side wall 18 as explained in greater detail below.

Figure 3:
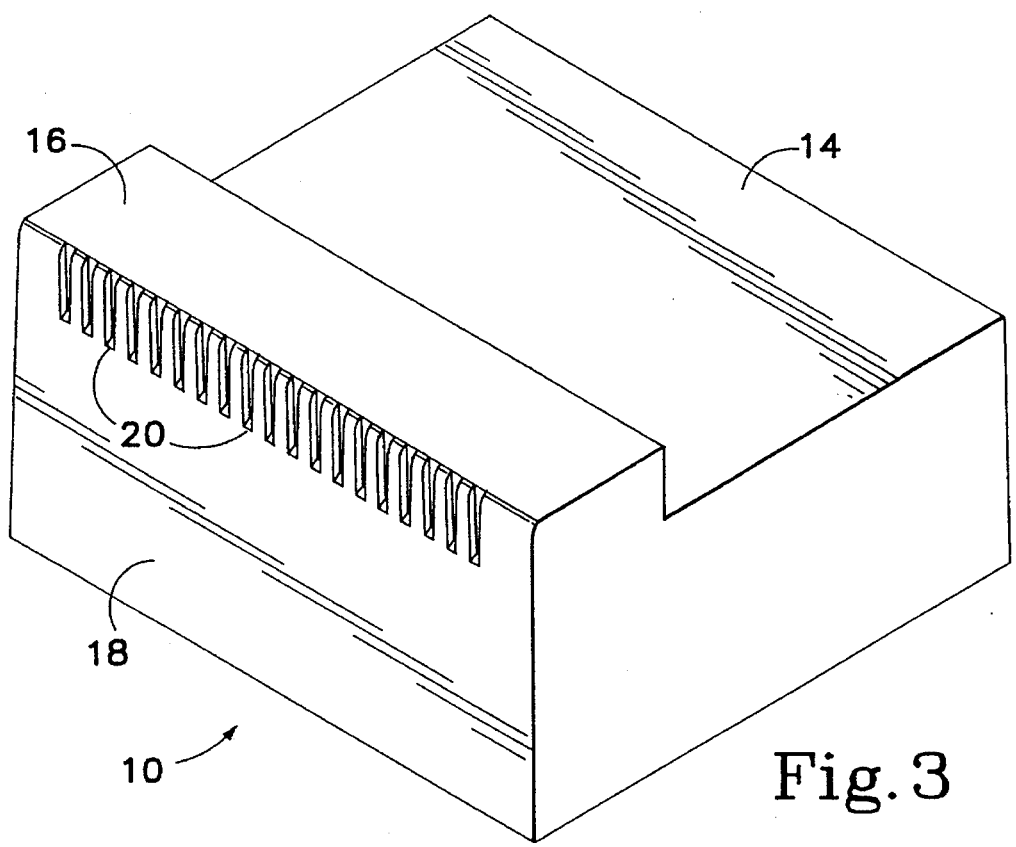
FIG. 3 is an alternative perspective view of the enclosure of FIGS. 1 and 2.
Figure 2:
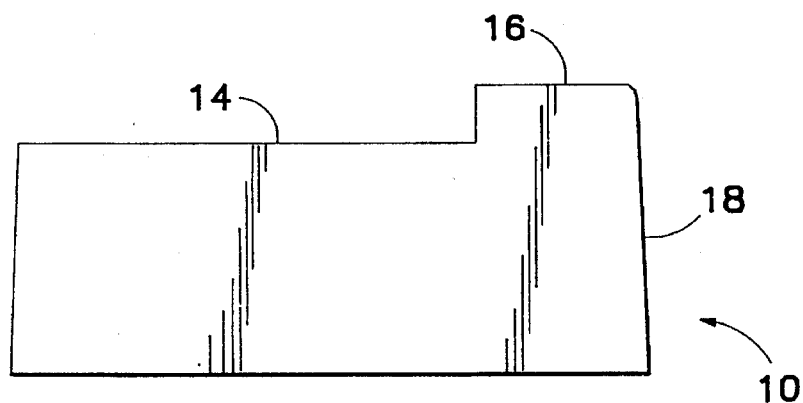
FIG. 2 is a side view of the enclosure of FIG. 1.

FIG. 3 is another perspective view of the enclosure 10, taken from a perspective roughly ninety degrees rotationally offset from the view of FIG. 1. Enclosure 10 may be formed of any suitable sturdy, substantially rigid material. A polymeric material is preferred for its lightweight and low unitcost of production. FIG. 2 is a side elevational view of the enclosure 10.

Figure 4:
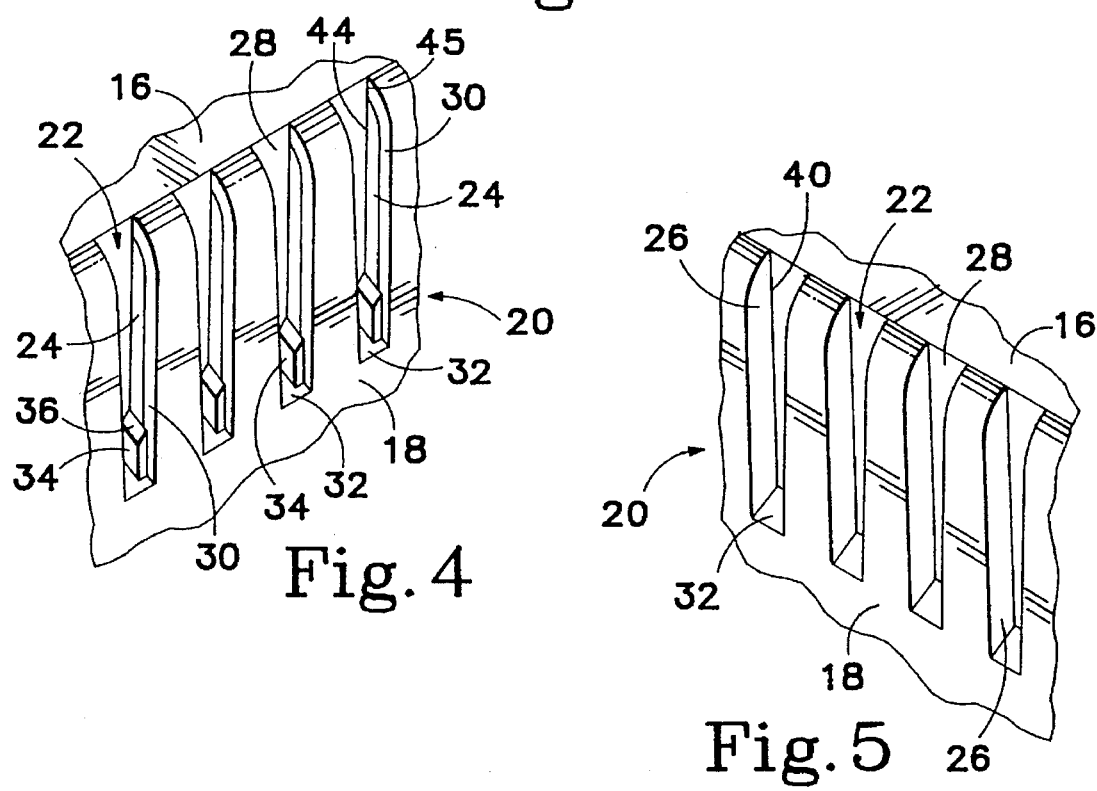
FIG. 4 is an enlarged view of a portion of the enclosure, showing several vent pockets in the same perspective as the view of FIG. 1.
Figure 5:
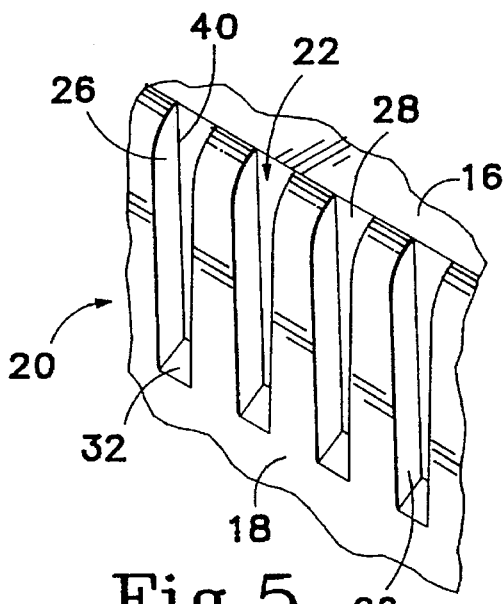
FIG. 5 is an enlarged view of a portion of the enclosure, showing several vent pockets in the same perspective as the view of FIG. 3.
Figure 6:
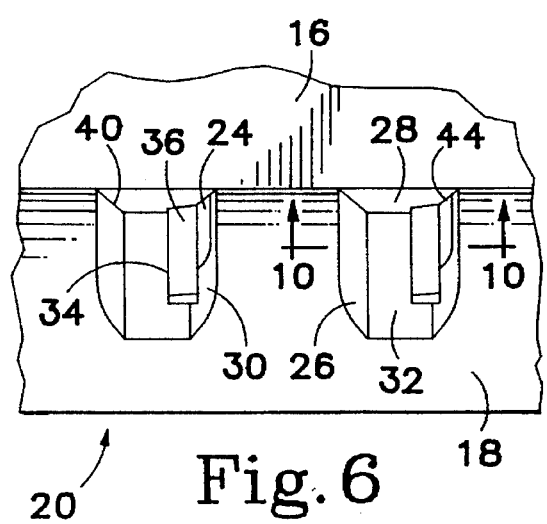
FIG. 6 is an enlarged top view of several vent pockets formed in the enclosure of the aforementioned figures.

FIGS. 4–6 show several of the vent pockets 20 in greater detail. In general, the vent pockets are formed in the enclosure side wall 18. Each vent pocket has an open top 22 in contact with the top surface 16 of the enclosure, and extending downward from top surface so that a liquid spilled onto the top surface may flow downward into the vent pocket 20. Before a more detailed discussion of the flow of liquid through the vent pocket, the structure of the vent pocket will be described.

Referring to FIGS. 4, 5 and 6, each vent pocket is formed in the enclosure side wall 18, extending downward from the top surface 16. Each vent pocket includes a closed sidewall 26, a frontwall 28 and an open sidewall 30. Both the open and closed sidewalls lie in respective planes that are nonparallel to the enclosure side wall 18, and preferably are generally perpendicular to it. In an alternative embodiment illustrated in FIG. 9 (top view), the closed sidewall 26 and open sidewall 30 may abut each other in a V-shape cross-section, the front wall thus being omitted.

In both embodiments, an aperture 24 is formed in the open sidewall 30 of the vent pocket, spaced below the top surface 16. Aperture 24 extends through the enclosure wall for ventilating equipment contained within the enclosure. Aperture 24 thus lies in a plane substantially orthogonal to the enclosure side wall 18 and to the enclosure top surface 16. However, preferably the vent pocket is tapered toward the bottom, i.e. the closed and open sidewalls are inclined away from each other.

Each vent pocket 20 includes a vent pocket floor 32 extending between the closed sidewall and the open sidewall, thereby forming a bottom of the vent pocket. The vent pocket floor is spaced below aperture 24 so that liquid that accumulates on the vent pocket floor does not flow into the enclosure through the aperture. The vent pocket floor 32 may be substantially horizontal or, preferably, it is sloped downward away from the frontwall 28 so that spilled liquid flowing down the through the vent pocket flows back out onto the enclosure sidewall without accumulation in the vent pocket.

Referring to FIG. 4, the vent pocket further includes a short wall 34 integrally formed therein. The short wall extends upward from the vent pocket floor 32 along the open sidewall 30. The top edge 36 of the short wall thus forms a lower boundary of aperture 24. The top edge 36 of the short wall is beveled downward and away from the aperture, i.e, toward the closed sidewall, for diverting spilled liquid away from the aperture. FIG. 5 is an alternative enlarged perspective view of several vent pockets, seen from a perspective similar to that of FIG. 3 in which the closed sidewalls are visible while the open sidewalls are not.

FIG. 6 is an enlarged, top view of the several vent portions. Referring to FIGS. 5 and 6, the front wall 28 and closed sidewall 26 intersect along a closed sidewall corner 40 which provides a liquid flow path as further described below. Referring to FIGS. 4 and 6, the frontwall 28 and the open sidewall 30 intersect only along a short region 45. Aperture 24, formed in the open sidewall 30, extends inwardly (toward the enclosure interior) up to the frontwall 28, so that there is no open sidewall corner region other than the short region 45.

Referring now to FIG. 7, an enlarged, rear elevational view illustrates flow of a liquid spilled onto the top surface 16 through the vent pocket 22. The liquid spilled on to top surface 16 forms a puddle 50, and from there flows into the vent pocket 22 as illustrated. We have found that such a spilled liquid tends to flow not only downward into the vent pocket, due to gravity, but also somewhat laterally, as indicated by arrows 48, toward the corner 40 formed by the intersection of the front wall 28 and the closed sidewall 26. The vent pocket described thus provides a predetermined flow path generally toward an intersection of the closed sidewall and the front wall, and downward along that intersection. This flow path has the effect of diverting the spilled liquid away from aperture 24 since the flow path is spaced apart from the aperture, as shown. A primary advantage of the inventive structure is minimization of the amount of spilled liquid that enters the enclosure through the aperture.

In FIG. 7, the spilled liquid 50 can accumulate on the vent pocket floor 32, depending upon the size of the spill. Such an accumulation or puddle on the vent pocket floor is indicated by reference number 52. The size of this accumulation also depends on the flow rate of the spilled liquid through the vent pocket. Adjacent of the floor of the vent pocket, it may be observed that the spilled liquid is no longer confined to the corner 40 flow path, but spreads out so as to cover the bottom of the pocket. The short wall 34, described above, prevents the liquid from wicking into the enclosure. The short wall height is selected to exceed the anticipated height of a bead of liquid formed in the bottom of the pocket. In the event that the liquid flowing through the vent pocket is of such a quantity and flow rate that it overflows the short wall and enters the enclosure, we have found that the liquid (generally water, coffee, etc.) nonetheless tends to adhere to the interior surface of the enclosure side wall and therefore flows down to the bottom of the enclosure without contacting internal electronic circuitry. In the typical application, the enclosure will also have apertures adjacent the bottom of the enclosure so that air may flow through the enclosure, entering through such lower apertures and exiting through the apertures described in the vent pockets. The spilled liquid flows out onto the enclosure side wall surface (stream 54) as it overflows the vent pocket.

FIG. 8 is a cross-sectional view of a vent pocket, taken along line 8—8 of FIG. 7, i.e looking into the enclosure through the aperture 24. The spilled liquid is omitted in this drawing for clarity. FIG. 8 shows how aperture 24 is spaced below the top surface 16, essentially due to the thickness of the enclosure sidewall material. The bottom of the aperture is spaced above the vent pocket floor due to the short wall. This figure also more clearly shows the beveled top edge 36 of the short wall 34 and the sloped bottom 32 of the vent pocket. The vent pocket floor is sloped downward and away from front wall 28.

In the alternative embodiment of FIG. 9, an alternative enclosure has a substantially horizontal top wall 17 and substantially vertical side wall 19. Vent pockets defining a V-shape configuration are formed by closed sidewalls 27 and open sidewalls 31, the open sidewalls having apertures 25 extending through the wall to the interior of the enclosure. In the alternative embodiment, a predetermined flow path is generally along the closed sidewall 27, and in the vicinity of an intersection 47 formed by the closed sidewall 27 and the open sidewall 31. This flow path carries spilled liquid through the vent pocket, while minimizing the amount of spilled liquid that enters the enclosure through aperture 25, in much the same fashion as the preferred U-shape configuration. Other variations in the exact configuration of the vent pockets will be apparent in light of this disclosure.

Making the Enclosure

The enclosure described may be molded of a polymeric material through an injection molding process. A polycarbonate material such as General Electric's Lexan(tm) 920A is preferred for that purpose. One feature of the invention is that it permits construction of the enclosure through injection molding without the need for slides and other expensive plastic tooling and molding procedures, as follows.

Toward that end, a steel mold for forming the enclosure comprises a cavity and a core, the cavity and the core being moveable relative to each other for removing a molded enclosure after the molding process is completed. The core is arranged for forming an interior surface of the enclosure according to a desired configuration, and the cavity of the mold is arranged for forming the exterior surface of the enclosure.

According to the invention, a rigid insert is fixed in the cavity of the mold for forming the vent pockets. More specifically, the insert has a plurality of beryllium-copper fingers which are sized and located so that each finger forms a corresponding vent pocket in the exterior surface of the molded enclosure consistent with the foregoing description. Accordingly, each finger has first and second side walls for forming the closed and open sidewalls of the vent pockets, respectively. In the core, a corresponding number of surfaces are provided to form the corresponding interior surfaces of the vent pockets.

Figure 10:
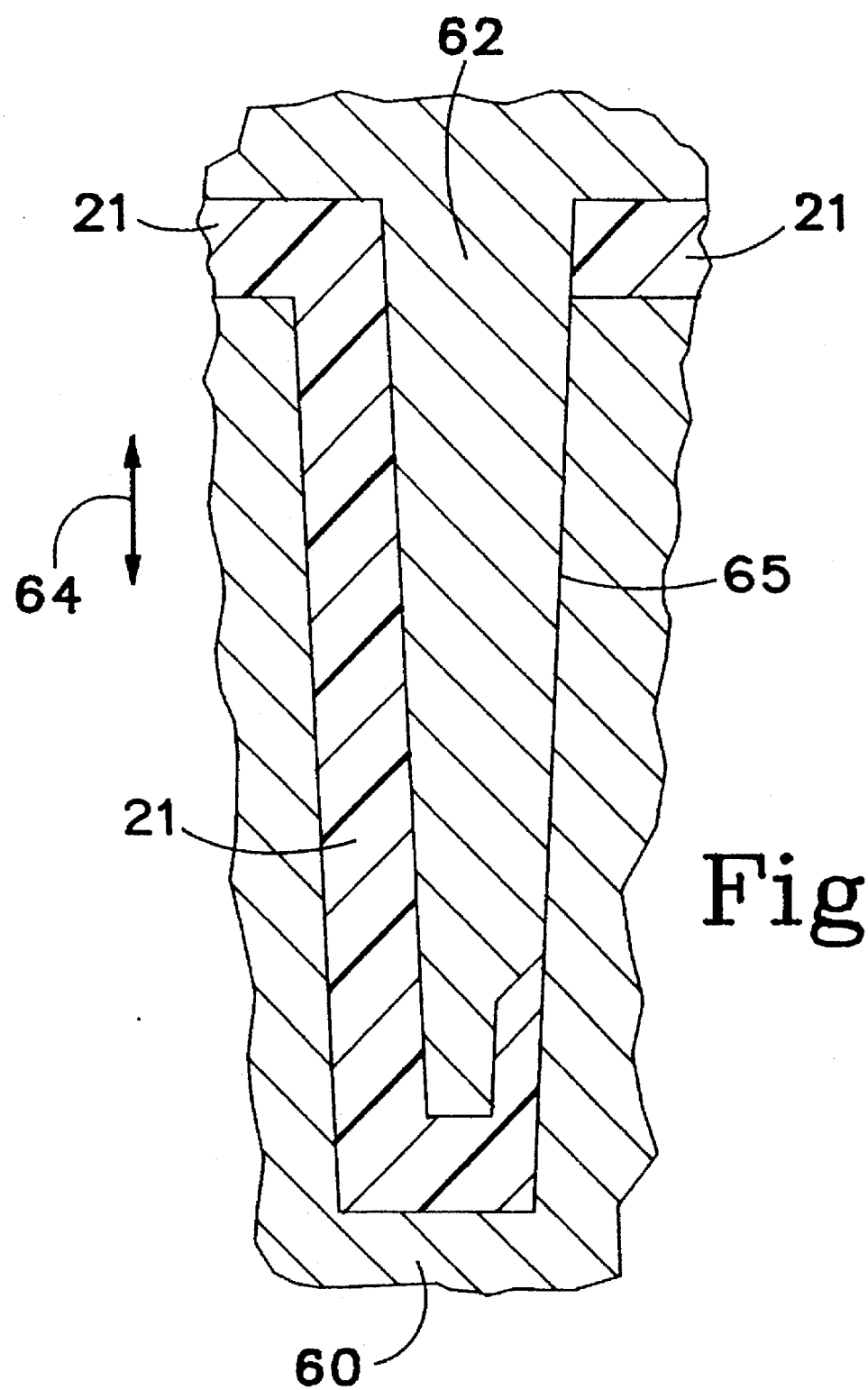
FIG. 10 is an enlarged, cross-sectional view of a U-shape vent pocket, taken along line 10—10 of FIG. 6, and illustrating a method of making the enclosure by injection molding.

Referring now to FIG. 10, a vent pocket is shown in cross-section, in a view taken along line 10—10 of FIG. 6. FIG. 10, however, illustrates the molding process. Here, a core 60 of the mold is configured to form the interior surface of the enclosure. One of the insert fingers 62 of the cavity is arranged to form a vent pocket in the enclosure surface. The enclosure is formed of polymeric material 21, introduced between the cavity and core during the molding process. Before the plastic is injected, the mold is closed by moving the core and cavity together as indicated by line 64. As the mold is closed, the cavity finger 62 comes into mating contact with the core 60 along a mating surface 65. The mating surface 65 is angled at a "shut off angle" of less than approximately 87 degrees. This metal-to-metal contact between the cavity and the core shuts off, i.e. prevents, injection of plastic into the region of contact, thereby forming the vent pocket aperture 24 (FIGS. 4 and 6), without complex slide assemblies or other more expensive tooling. This results in substantial savings in tooling costs and simplifies the process for making the enclosure.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. An electronic equipment enclosure comprising:

a substantially horizontal top surface;

a substantially vertical side wall coupled to the top surface; and a series of vent pockets formed in the sidewall, each vent pocket having an open top end in communication with the top surface and extending downward from the top surface, so that a liquid spilled onto the top surface flows downward into the vent pocket through the open top;

each vent pocket further having an aperture that extends through the enclosure sidewall for ventilating the enclosure and having means for directing the liquid generally along a predetermined flow path spaced apart from the aperture so that the liquid runs off the top surface and through the vent pocket substantially without entering the enclosure through the aperture.

2. An equipment enclosure according to claim 1 wherein: each vent pocket includes a closed sidewall and an open sidewall, the open and closed sidewalls abutting each other in a V-shape cross-section; and the aperture is formed in the open sidewall of the vent pocket, spaced below the top surface, so that the flow path extends generally along the closed sidewall and along an intersection of the closed sidewall and the open sidewall.

3. An equipment enclosure according to claim 1 wherein: each vent pocket includes a closed sidewall, and front wall and an open sidewall, arranged in a generally U-shape cross-section; and the aperture is formed in the open sidewall of the vent pocket, spaced below the top surface, so that the aperture lies in a substantially vertical plane, substantially orthogonal to the enclosure sidewall and the enclosure top surface, and the flow path extends generally along an intersection of the closed sidewall and the front wall.

4. An equipment enclosure according to claim 3 wherein:

the closed sidewall and the open sidewall are sloped away from each other toward the top end of the vent pocket.

5. An equipment enclosure according to claim 3 wherein each vent pocket includes a vent pocket floor extending between the closed sidewall and the open sidewall, thereby forming a bottom of the vent pocket, the vent pocket floor being spaced below the aperture so that the flow path extends below the aperture, thereby circumventing the aperture to minimize flow of the liquid through the aperture into the enclosure.

6. An equipment enclosure according to claim 5 wherein: the vent pocket floor is substantially horizontal so that a limited quantity of liquid flowing down in the vent pocket accumulates on the vent pocket floor before spilling out of the vent pocket onto the enclosure sidewall.

7. An equipment enclosure according to claim 5 wherein the vent pocket floor is sloped downward away from the front wall.

8. An equipment enclosure according to claim 5 wherein the vent pocket further includes a short wall integrally formed therein, the short wall extending upward from the vent pocket floor along the open sidewall and having a top edge that forms a lower boundary of the aperture, the short wall top edge being beveled downward and away from the aperture toward the closed sidewall of the vent pocket for diverting the spilled liquid away from the aperture.

9. An equipment enclosure according to claim 8 wherein the enclosure is formed of an injected molded polycarbonate material.

10. An equipment enclosure according to claim 8 wherein the enclosure is formed of a substantially rigid polymeric material.

11. An equipment enclosure according to claim 8 wherein the top surface includes a lower portion and an elevated portion, and the enclosure sidewall having the vent pockets is coupled to the enclosure top surface along a peripheral edge of the elevated portion, whereby liquid spilled onto the lower portion of the top surface can run off of the enclosure without entering the vent pockets.

12. An equipment enclosure according to claim 8 wherein the vent pocket sidewalls are sloped at an angle of at least approximately 87 degrees.

13. A method of providing spill-resistant ventilation in an equipment enclosure having a top surface and a side wall, the method comprising:

forming a plurality of vent pockets extending into the sidewall along a peripheral edge of the top surface, each vent pocket having an open top end in communication with the top surface for receiving a liquid spilled onto the top surface and extending generally downward in the side wall;

within each vent pocket, forming an aperture extending through the enclosure sidewall for ventilating the enclosure; and within each vent pocket, providing a liquid flow path spaced apart from the aperture, thereby minimizing flow of the spilled liquid through the aperture into the enclosure.

14. A method according to claim 13 further comprising the step of configuring each vent pocket as a generally vertical, U-shape channel defined by a front wall, a closed sidewall and an open sidewall, the front wall being generally parallel to the enclosure side wall; and wherein the aperture is formed in the open sidewall, so that the front wall and the closed sidewall together provide the liquid flow path.

15. A method according to claim 14 further comprising:

positioning the aperture on the open wall spaced below the top surface so that liquid entering the vent pocket from the top surface tends to flow across the front wall toward the liquid flow path rather than into the aperture.

16. A method according to claim 14 further comprising:

in each vent pocket, forming a floor extending between the closed sidewall and the open sidewall, thereby defining a bottom of the vent pocket; and positioning the aperture on the open wall spaced above the bottom of the vent pocket so that liquid on the bottom of the vent pocket cannot enter the enclosure through the aperture.

17. A method according to claim 13 wherein the vent pocket includes a sidewall oriented substantially orthogonal to the top surface and the enclosure side wall, and the aperture is formed in the said orthogonal sidewall.

* * * * *